United States Patent
Park et al.

(10) Patent No.: US 6,514,826 B1
(45) Date of Patent: Feb. 4, 2003

(54) METHOD OF FORMING A GATE ELECTRODE IN A SEMICONDUCTOR DEVICE

(75) Inventors: Dae Gyu Park, Ichon-Shi (KR); Tae Ho Cha, Ichon-Shi (KR)

(73) Assignee: Hyundai Electronics Industries Co., Ltd., Ichon-shi (KR)

(*) Notice: Subject to any disclaimer, the term of this patent is extended or adjusted under 35 U.S.C. 154(b) by 0 days.

(21) Appl. No.: 09/721,636

(22) Filed: Nov. 27, 2000

(30) Foreign Application Priority Data

Dec. 22, 1999 (KR) .......................................... 99-60557

(51) Int. Cl.⁷ .......................................... H01L 21/336
(52) U.S. Cl. .................. 438/287; 438/197; 438/240; 438/585
(58) Field of Search ................ 438/287, 299, 438/585, 591, 197, 216, 240, 261

(56) References Cited

U.S. PATENT DOCUMENTS

| | | |
|---|---|---|
| 4,397,077 A | 8/1983 | Derbenwick et al. |
| 4,895,520 A | 1/1990 | Berg |
| 5,106,776 A | 4/1992 | Shen et al. |
| 5,219,778 A | 6/1993 | Dennison et al. |
| 5,298,436 A | 3/1994 | Radosevich et al. |
| 5,300,450 A | 4/1994 | Shen et al. |
| 5,405,796 A | 4/1995 | Jones, Jr. |
| 5,716,875 A | 2/1998 | Jones, Jr. et al. |
| 5,763,922 A * | 6/1998 | Chau ........................... 257/371 |
| 5,907,780 A | 5/1999 | Gilmer et al. |
| 5,923,056 A | 7/1999 | Lee et al. |
| 5,960,270 A | 9/1999 | Misra et al. |
| 6,010,927 A | 1/2000 | Jones, Jr. et al. |
| 6,066,525 A | 5/2000 | Liu et al. |

FOREIGN PATENT DOCUMENTS

JP          62-204567          9/1987

* cited by examiner

Primary Examiner—Tuan H. Nguyen
Assistant Examiner—Jack Chen
(74) Attorney, Agent, or Firm—Finnegan, Henderson, Farabow, Garrett, & Dunner, L.L.P.

(57) ABSTRACT

There is disclosed a method of forming a gate electrode in a semiconductor device. The present invention forms a gate insulating film using $(TiO_2)_x(Al_2O_3)_{x-1}$ in which a titanium oxide film ($TiO_2$) having a high dielectric constant and an aluminum oxide film having leakage and interfacial property are mixed. Therefore, the present invention could not only improve the leakage current characteristic of a semiconductor device but also early develop a high-speed device having a high density in the future.

20 Claims, 1 Drawing Sheet

METHOD OF FORMING A GATE ELECTRODE IN A SEMICONDUCTOR DEVICE

CROSS-REFERENCE TO RELATED APPLICATION

Priority is claimed from Republic of Korean Patent Application No. 99-60557 filed Dec. 22, 1999, which is incorporated in its entirety by reference.

BACKGROUND OF THE INVENTION

1. Field of the Invention

The invention relates generally to a method of forming a gate electrode in a semiconductor device. More particularly, the present invention relates to a method of forming a gate electrode in a semiconductor device by which $(TiO_2)_x(Al_2O_3)_{1-x}$, wherein x has a value ranging from approximately 0.05 to approximately 0.85, in which a titanium oxide film ($TiO_2$) having a high dielectric constant and leakage characteristic and an aluminum oxide film having a good interfacial property are mixed, is used as a gate insulating film.

2. Description of the Prior Art

In a semiconductor device such as DRAM, logic, etc. that has been mass-produced presently, a silicon oxide film ($SiO_2$) grown by thermal process or a rapid thermal process is mainly used as a gate insulating layer. As the design rule is scaled downed, however, the thickness of the silicon oxide film is scaled down below approximately 25 to approximately 30 A being a limit to the tunneling. Thus, it is expected that the gate insulating film of 0.1 μm technology will result in approximately 15 to approximately 20 A in thickness. Due to the off current increased by direct tunneling, however, there is a possibility that it may adversely affect the operation of a device. Particularly, in case of a memory device, every effort to reduce the leakage current has been made. Recently, as a result of these efforts, many researches into attempt to adopt an insulating material having a high dielectric constant as a gate insulting film have been carried out. Among them, a research by which an tantalum oxide film ($Ta_2O_5$) used as a dielectric film of a capacitor is used as a gate insulating film had been mostly actively carried out. However, if the tantalum oxide film is used as the gate insulating film and a polysilicon film is used as the gate electrode, due to reaction between the tantalum oxide film and the polysilicon film in an interface between the tantalum oxide film and the polysilicon oxide film, a silicon oxide film is formed, resulting in increase in the thickness of the entire oxide film. At this time, in order to prevent this reaction, a metal structure of a barrier metal layer such as TiN and tungsten may be used. In this case, however, as variations such as the threshold voltage shift, etc. are caused, various types of optimization such as counter doping within a channel, etc. are required. Therefore, it is found that there is a limit to applying the conventional technology.

On the other hand, it was found that a dielectric film or a gate insulating film of a capacitor using an aluminum oxide film ($Al_2O_3$), that has been recently researched actively, has a good leakage current characteristic of <10–9A/cm$^2$ and a god interfacial property ($D_{it}$<1×10$^{11}$eV$^{-1}$ cm$^{-1}$). Also, it shows a preferred effect and a stable characteristic during process at high temperature. Meanwhile, in case of a titanium oxide film ($TiO_2$) having a dielectric constant of about 25 about 3 5, it has a high dielectric constant, but has a drawback that it has a high leakage current since bulk traps or interface defects within a thin film are great.

SUMMARY OF THE INVENTION

In order to accomplish the above object, a method of forming a gate electrode in a semiconductor device according to the present invention is characterized in that it comprises the steps of forming a $(TiO_2)_x(Al_2O_3)_{1-x}$ film on a semiconductor substrate, forming a conductive film on the entire structure and patterning the conductive film and the $(TiO_2)_x(Al^2O_3)_{1-x}$ film to form a gate electrode.

BRIEF DESCRIPTION OF THE DRAWINGS

The aforementioned aspects and other features of the present invention will be explained in the following description, taken in conjunction with the accompanying drawings, wherein.

DETAILED DESCRIPTION OF PREFERRED EMBODIMENTS

The present invention will be described in detail by way of a preferred embodiment with reference to accompanying drawings.

The present invention employs, as a gate insulating film, $(TiO_2)_x(Al_2O_3)_{1-x}$, wherein x has a value ranging from approximately 0.05 to approximately 0.85, in which a titanium oxide film ($TiO_2$) having a dielectric constant of 7 times higher than a silicon oxide film (k=3.85) and an aluminum oxide film having a good leakage current and an interfacial property are mixed. At this time, the titanium has an energy band gap of about 3.25 eV and has a high dielectric constant of 50 but has a poor leakage characteristic. Also, the aluminum oxide film has an energy band gap of about 9 eV and has a high dielectric constant of about 7 about 10. Particularly, the aluminum oxide film has a good interfacial property and is thermally very stable during reactive sputtering using doped aluminum. Therefore, it is possible to form a gate insulating film having good leakage interfacial property and also having a good high dielectric constant, by mixing an aluminum oxide and a titanium oxide film in a certain composition.

Figure 1A:
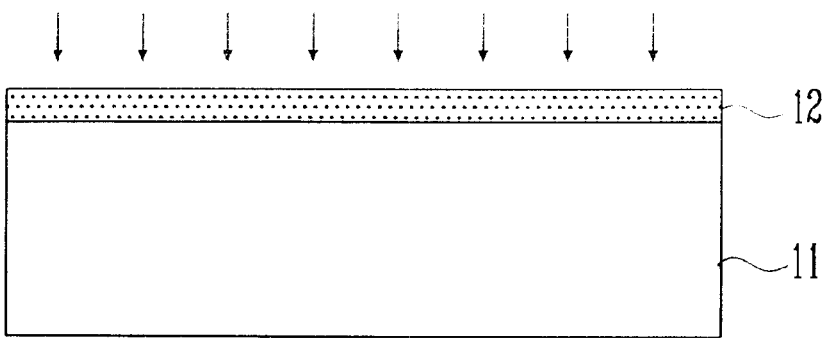
FIGS. 1A to 1C are cross-sectional views of a device for explaining a method of forming a gate electrode in a semiconductor device.
Figure 1B:
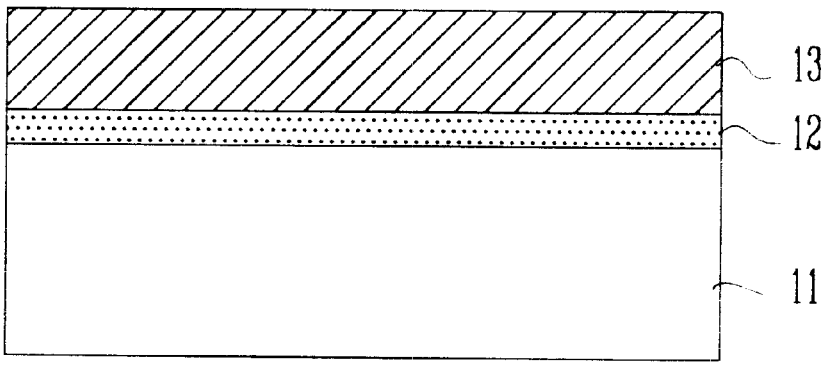
Figure 1C:
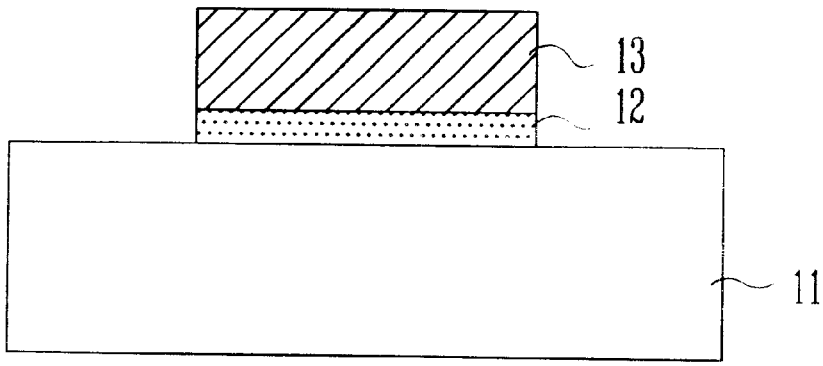

FIGS. 1A to 1C are cross-sectional views of a device for explaining a method of forming a gate electrode in a semiconductor device.

Referring now to FIG. 1A, there is shown a sectional view of a device in which after a device separation film (not shown) is formed on a given region of a semiconductor substrate 11, a $(TiO_2)_x(Al_2O_3)_{1-x}$ film 12 is formed on the entire structure in thickness of about 10 about 250A, by reactive sputtering method under $O_2$/Ar atmosphere using TiAl$_x$ as a target.

The $(TiO_2)_x(Al_2O_3)_{1-x}$ film may be formed by reactive sputtering using DC magnetron or RF plasma having the power density of about 0.14 about 7 W/cm$^2$ (in case of 8 inch wafer, 100 W about 5 kW). If the RF plasma is employed, Al or Ti is used as a RF coil and the electric power for controlling the bias between the coil and the substrate is about –300 about 300 W. Also, the reactive sputtering process may be performed under Ar atmosphere having $O_2$ of 10 about 100 sccm and Ar of 10 about 45 sccm and its deposition temperature is about –25° C. to about 750° C.

Also, doped TiAl$_x$ may be used as the target for forming the $(TiO_2)_x(Al_2O_{3x-1}$ film other than TiAlx and Si, Zr, HF, Y and W having the concentration of 0.1~7 mole % may be used as the dopant at this time.

Meanwhile, the $(TiO_2)_x(Al_2O_3)_{1-x}$ film may be formed by other process than the reactive sputtering process. That is, a target in which $TiO_2$ and $Al_2O_3$ are mixed, may be deposited using DC magnetron or RF power under Ar atmosphere. Also, it may be deposited by CVD method using inorganic source, in which $AlCl_3$ (or DEMA) and $TiCl_3$ precursor is used along with $H_2$ and $H_2O$ vapor and a plasma CVD or LPCVD of about 200 about 850° C. is used. Further, it may be deposited by CVD method using metal organic source, in which a Ti precursor of TDMAT, TDEAT and $Ti(CH_3)_3$ (trimethyl Ti) an Al precursor of $Al(CH_3)_3$(trimethyl Al) are used along with $H_2$ and $H_2O$ vapor, and a plasma CVD or LPCVD of about 150 about 750° C. isused.

After the $(TiO_2)_x(Al_2O_3)_{1-x}$ film is formed, an annealing process may be implemented in order to improve the quality of the thin, in which a furnace annealing process may be implemented under oxygen or nitrogen atmosphere at the temperature of about 450 about 850° C. for 30 minutes and a rapid thermal process may be implemented under $O_2$ or $N_2O$ atmosphere on the lamp-up condition of 20–80° C./sec at the temperature of about 450 about 850° C. for about 10 about 120 seconds.

FIG. 1 (c) is a cross-sectional view of the device in which after the conductive film 13 and the $(TiO_2)_x(Al_2O_3)_{1-x}$ film 12 are patterned to form a gate electrode.

As another embodiment of the present invention, before the $(TiO_2)_x(Al_2O_3)_{1-x}$ film is deposited, a very thin silicon oxide film of 2–10 Å may be formed in order to improve the interfacial property between the semiconductor substrate and the $(TiO_2)_x(Al_2O_3)_{1-x}$ film.

Further, the present invention is not limited to a method of forming a gate insulating film but may be applied to a dielectric film in a capacitor of a DRAM device.

As mentioned above, the present invention cannot only improve the leakage current characteristic of a semiconductor device by forming a $(TiO_2)_x(Al_2O_3)_{1-x}$ film as a gate insulating film. Also, it is expected that the present invention can assist in early developing a high-speed device having a high density in the future.

The present invention has been described with reference to a particular embodiment in connection with a particular application. Those having ordinary skill in the art and access to the teachings of the present invention will recognize additional modifications and applications within the scope thereof.

It is therefore intended by the appended claims to cover any and all such applications, modifications, and embodiments within the scope of the present invention.

What is claimed is:

1. A method of forming a gate electrode in a semiconductor device, comprising the steps of:

forming a $(TiO_2)_x(Al_2O_3)_{1-x}$ film on a semiconductor substrate, wherein x has a value ranging from approximately 0.05 to approximately 0.85, forming a conductive film on the entire structure, and patterning said conductive film and said $(TiO_2)_x(Al_2O_3)_{1-x}$ film to form a gate electrode.

2. The method according to claim 1, wherein forming said $(TiO_2)_x(Al_2O_3)_{1-x}$ film comprises reactive sputtering, wherein said reactive sputtering comprises using a target comprising TiAlx and an atmosphere comprising $O_2$ and Ar.

3. The method according to claim 2, wherein said reactive sputtering comprises using a plasma chosen from a magnetron plasma and a RF plasma having a power density ranging from approximately 0.14 to approximately 7W/cm².

4. The method according to claim 3, wherein said RF plasma comprises a coil chosen from Al and Ti coils and applies a power ranging from approximately –300 to approximately 300W to control a bias between the coil and the substrate.

5. The method according to claim 2, wherein said atmosphere comprises $O_2$ introduced in an amount ranging from approximately 10 to approximately 100 sccm and Ar introduced in an amount ranging from approximately 10 to approximately 45 sccm.

6. The method according to claim 2, wherein said reactive sputtering comprises reactive sputtering at a temperature ranging from approximately –25° C. to approximately 750° C.

7. The method according to claim 2, wherein said target comprises doped $TiAl_x$.

8. The method according to claim 7, wherein said doped $TiAl_x$ comprises at least one dopant chosen from Si, Zr, HF, and Y and wherein said at least one dopant is included in a molar concentration ranging approximately from 0.1 to approximately 7%.

9. The method according to claim 1, wherein said $(TiO_2)_x(Al_2O_3)_{1-x}$ film has a thickness ranging from approximately 10 to approximately 250 Å.

10. The method of forming a gate electrode in a semiconductor device according to claim 1, wherein said $(TiO_2)_x(Al_2O_3)_{1-x}$ film is formed using a target in which $TiO_2$ and $Al_2O_3$ are mixed, by a DC magnetron or a RIF power under Ar atmosphere.

11. The method according to claim 1, wherein forming said $(TiO_2)_x(Al_2O_3)_{1-x}$ film comprises a method chosen from CVD and LPCVD using a precursor chosen from $AlCl_3$, DEMA, and $TiCl_3$ precursors, an atmosphere comprising $H_2$ and $H_2O$ vapor, and a temperature of from approximately 200° to approximately 850° C.

12. The method according to claim 1, wherein forming said $(TiO_2)_x(Al_2O_3)_{1-x}$ film comprises using a method chosen from plasma CVD and LPCVD; a Ti precursor chosen from TDMAT, TDEAT, and $Ti(CH_3)_3$; a Al precursor of $Al(CH_3)_3$; an atmosphere comprising $H_2$ and $H_2O$ vapor; and a temperature ranging from approximately 150 to approximately 750° C.

13. The method according to claim 1, further comprising annealing said $(TiO_2)_x(Al_2O_3)_{1-x}$ film.

14. The method according to claim 13, wherein said annealing comprises a furnace annealing process under an atmosphere comprising oxygen, at a temperature ranging from approximately 450 to approximately 850° C., and for 30 minutes.

15. The method according to claim 13, wherein said annealing comprises a rapid thermal process comprising a lamp-up condition ranging from approximately 20 to approximately 80° C./sec and an atmosphere comprising one of $O_2$ and $N_2O$, at a temperature ranging from approximately 450 to approximately 950° C., and for approximately 10 to approximately 120 seconds.

16. The method according to claim 1, wherein said conductive film comprises at least one material chosen from polysilicon, polycide, and metal.

17. The method according to claim 16, wherein said polycide is chosen from W-polycide, Ti-polycide, and Mo-polycide.

18. The method according to claim 16, wherein said metal is chosen from W, Ta, WN, and TaN.

19. The method of forming a gate electrode in a semiconductor device according to claim 1, further including the step of forming a silicon oxide film before said $(TiO_2)_x(Al_2O_3)_{1-x}$ film is formed.

20. The method according to claim 19, wherein said silicon oxide film has a thickness ranging approximately from 2 to approximately 10Å.

* * * * *